United States Patent
Prakah-Asante

(10) Patent No.: US 10,061,557 B1
(45) Date of Patent: Aug. 28, 2018

(54) METHOD OF CONTROLLING AUDIO SPEAKER SETTINGS IN A VEHICLE BASED ON DYNAMIC DETERMINATION OF THE OCCUPANCY STATE OF A REAR ROW OF SEATING AND A VEHICLE PROVIDING SUCH CONTROL

(71) Applicant: Ford Global Technologies, LLC, Dearborn, MI (US)

(72) Inventor: Kwaku O. Prakah-Asante, Commerce Township, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/661,559

(22) Filed: Jul. 27, 2017

(51) Int. Cl.
| | |
|---|---|
| *G06F 3/16* | (2006.01) |
| *H04B 1/08* | (2006.01) |
| *H03G 3/20* | (2006.01) |
| *B60R 16/037* | (2006.01) |
| *B60N 2/00* | (2006.01) |
| *H04M 1/60* | (2006.01) |
| *G06F 3/0488* | (2013.01) |
| *G06F 3/0481* | (2013.01) |

(52) U.S. Cl.
CPC ............ *G06F 3/165* (2013.01); *B60N 2/002* (2013.01); *B60R 16/037* (2013.01); *H03G 3/20* (2013.01); *H04B 1/082* (2013.01); *B60L 2250/12* (2013.01); *B60L 2260/20* (2013.01); *B60L 2260/46* (2013.01); *G06F 3/0488* (2013.01); *G06F 3/04817* (2013.01); *H04M 1/6083* (2013.01); *H04R 2499/13* (2013.01)

(58) Field of Classification Search
CPC . H04M 1/6083; H04B 1/082; H04R 2499/13; H03G 3/20; B60N 2/002; B60L 2250/12; B60L 2260/20; B60L 2260/46; B60L 2260/48
USPC .............................. 700/94; 381/71.6, 86, 302
See application file for complete search history.

(56) References Cited

U.S. PATENT DOCUMENTS 6,778,672 B2 *   8/2004  Breed ................... B60R 16/037
                                                              381/86
7,460,919 B2 * 12/2008  Hirayama ............ G10H 1/0041
                                                              381/107
(Continued)

FOREIGN PATENT DOCUMENTS

GB              2430817 A   *   4/2007

*Primary Examiner* — Jesse A Elbin
(74) *Attorney, Agent, or Firm* — Vichit Chea; Price Heneveld LLP

(57) ABSTRACT

A method of controlling audio speaker settings in a vehicle with a rear row of seating comprises: requesting an operator of the vehicle to make a choice between a first option, wherein the vehicle automatically controls audio speaker settings based on a dynamically determined occupancy state of the rear row of seating, and a second option, wherein the vehicle recommends audio speaker settings to the operator based on the dynamically determined occupancy state; dynamically determining the occupancy state; if the operator chooses the first option, then automatically controlling audio speaker settings based on the dynamically determined occupancy state; and if the operator chooses the second option, then providing recommended audio speaker settings to the operator based on the dynamically determined occupancy state. The audio speaker settings include volume.

20 Claims, 8 Drawing Sheets

(56) References Cited

U.S. PATENT DOCUMENTS

| | | |
|---|---|---|
| 8,284,041 B2 | 10/2012 | Cuddihy et al. |
| 9,043,006 B2 * | 5/2015 | Akatsu ................. H04R 3/00 |
| | | 381/302 |
| 2004/0170286 A1 | 9/2004 | Durach et al. |
| 2016/0029111 A1 | 1/2016 | Wacquant et al. |
| 2017/0048606 A1 * | 2/2017 | Fan ................. H04R 1/1041 |

* cited by examiner

US 10,061,557 B1

METHOD OF CONTROLLING AUDIO SPEAKER SETTINGS IN A VEHICLE BASED ON DYNAMIC DETERMINATION OF THE OCCUPANCY STATE OF A REAR ROW OF SEATING AND A VEHICLE PROVIDING SUCH CONTROL

FIELD OF THE INVENTION

The present invention generally relates to providing a reminder or automatically controlling the settings of audio speakers, such as the volume of the audio that the rear audio speakers are generating, based on the occupancy state, and a vehicle providing such control.

BACKGROUND OF THE INVENTION

Some vehicles include a rear row of seating with rear audio speakers generating sound primarily directed to occupants of the rear row of seating. The settings of the rear audio speakers, such as volume, are generally controllable.

SUMMARY OF THE INVENTION

According to a first aspect of the present invention, a method of controlling audio speaker settings in a vehicle with a rear row of seating comprises: requesting an operator of the vehicle to make a choice between a first option, wherein the vehicle automatically controls audio speaker settings based on a dynamically determined occupancy state of the rear row of seating, and a second option, wherein the vehicle recommends audio speaker settings to the operator based on the dynamically determined occupancy state; dynamically determining the occupancy state; if the operator chooses the first option, then automatically controlling audio speaker settings based on the dynamically determined occupancy state; and if the operator chooses the second option, then providing recommended audio speaker settings to the operator based on the dynamically determined occupancy state.

Embodiments of the first aspect of the invention can include any one or a combination of the following features:
  The audio speaker settings include volume;
  Automatically controlling rear audio speaker settings based on the dynamically determined occupancy state comprises decreasing rear audio speaker volume if the occupancy state is dynamically determined to have changed from occupied to unoccupied;
  Automatically controlling rear audio speaker settings based on the dynamically determined occupancy state comprises increasing rear audio speaker volume if the occupancy state is dynamically determined to have changed from unoccupied to occupied;
  Dynamically determining the occupancy state comprises using more than one input, assigning a weight to each input to provide weighted inputs, summing the weighted inputs to provide a summation, and determining the occupancy state based on the summation;
  The more than one input includes whether a passenger rear door has opened;
  Requesting the operator to make a choice between the first option and the second option comprises presenting a first graphical representation symbolizing the first option and a second graphical representation symbolizing the second option on a touch screen user interface and the operator makes the choice by touching either the first graphical representation or the second graphical representation;
  Providing recommended rear audio speaker settings to the operator based on the dynamically determined occupancy state comprises providing a recommendation that rear audio speaker volume be decreased to a predetermined volume level after the dynamically determined occupancy state changes from occupied to unoccupied, and providing a recommendation that rear audio speaker volume be increased to a predetermined volume level after the dynamically determined occupancy state changes from unoccupied to occupied;
  Notifying the operator that the rear audio speaker volume has been decreased after automatically decreasing rear audio speaker volume;
  Notifying the operator that the rear audio speaker volume has been increased after automatically increasing rear audio speaker volume;
  Prompting the operator to accept or reject the recommended rear audio speaker settings;
  If the operator accepts the recommended rear audio speaker settings, then implementing the recommended rear audio speaker settings; and
  if the operator rejects the provided recommendation that rear audio speaker volume be decreased after the dynamically determined occupancy state changes from occupied to unoccupied, then not implementing the recommended rear audio speaker settings and providing a subsequent recommendation that rear audio speaker volume not be decreased if the dynamically determined occupancy state subsequently changes from occupied to unoccupied.

According to a second aspect of the present invention, a vehicle comprises: a rear row of seating; one or more rear audio speakers having settings; one or more sensors, from which an occupancy state of the rear row of seating can be determined; a user interface; a controller in communication with the user interface, the one or more rear audio speakers, and the one or more sensors; wherein, the controller dynamically determines the occupancy state of the rear row of seating based on data provided by the one or more sensors; wherein, the controller, via the user interface, requests an operator of the vehicle to make a choice between a first option, wherein the controller automatically controls the settings of the one or more rear audio speakers based on the occupancy state of the rear row of seating, and a second option, wherein the controller recommends settings, via the user interface to the operator, for the one or more rear audio speakers based on the occupancy state of the rear row of seating.

Embodiments of the second aspect of the invention can include any one or a combination of the following features:
  If the operator chooses the first option, then the controller automatically sets the settings of the one or more rear audio speakers based on the occupancy state of the rear row of seating;
  If the operator chooses the second option, then the controller provides to the operator, via the user interface, recommended settings of the one or more rear audio speakers based on the occupancy state of the rear row of seating;
  The settings of the one or more rear audio speakers include volume;
  If the operator chooses the first option, then the controller further decreases the volume of the one or more rear audio speakers, if the controller dynamically determines that the occupancy state changes from occupied to unoccupied, and increases the volume of the one or more rear audio speakers if the controller dynamically determines that the occupancy state changes from unoccupied to occupied;

The one or more sensors provide more than one input to the controller;

The controller assigns a weight to each input to provide weighted inputs, sums the weighted inputs to provide a summation, and determines the occupancy state based on the summation;

The vehicle further includes a rear passenger door, wherein, the one or more sensors include a door condition sensor, wherein, the controller determines based on the input provided by the door condition sensor that the rear passenger door has opened; and wherein, the controller determines the occupancy state based, at least in part, on the determination that the rear passenger door has opened;

The user interface is a touch screen;

The user interface displays a first graphical representation symbolizing the first option and a second graphical representation symbolizing the second option;

The operator makes the choice by touching either the first graphical representation or the second graphical representation;

If the operator chooses the second option, then the controller further recommends to the operator, via the user interface, that the volume of the one or more rear audio speakers be decreased if the controller dynamically determines that the occupancy state changes from occupied to unoccupied, and recommends to the operator, via the user interface, that the volume of the one or more rear audio speakers be increased if the controller dynamically determines that the occupancy state changes from unoccupied to occupied;

The controller, via the user interface, notifies the operator that the volume of the one or more rear audio speakers has been decreased after the controller automatically decreased the volume of the one or more rear audio speakers;

The controller, via the user interface, notifies the operator that the volume of the one or more rear audio speakers has been increased after the controller automatically increased the volume of the one or more rear audio speakers; and If the controller recommends to the operator, via the user interface, that the volume of the one or more rear audio speakers be increased or decreased, then the controller prompts the operator, via the user interface, to accept or reject the recommended rear audio speaker settings.

These and other aspects, objects, and features of the present invention will be understood and appreciated by those skilled in the art upon studying the following specification, claims, and appended drawings.

DETAILED DESCRIPTION OF THE PREFERRED EMBODIMENTS

Figure 1:
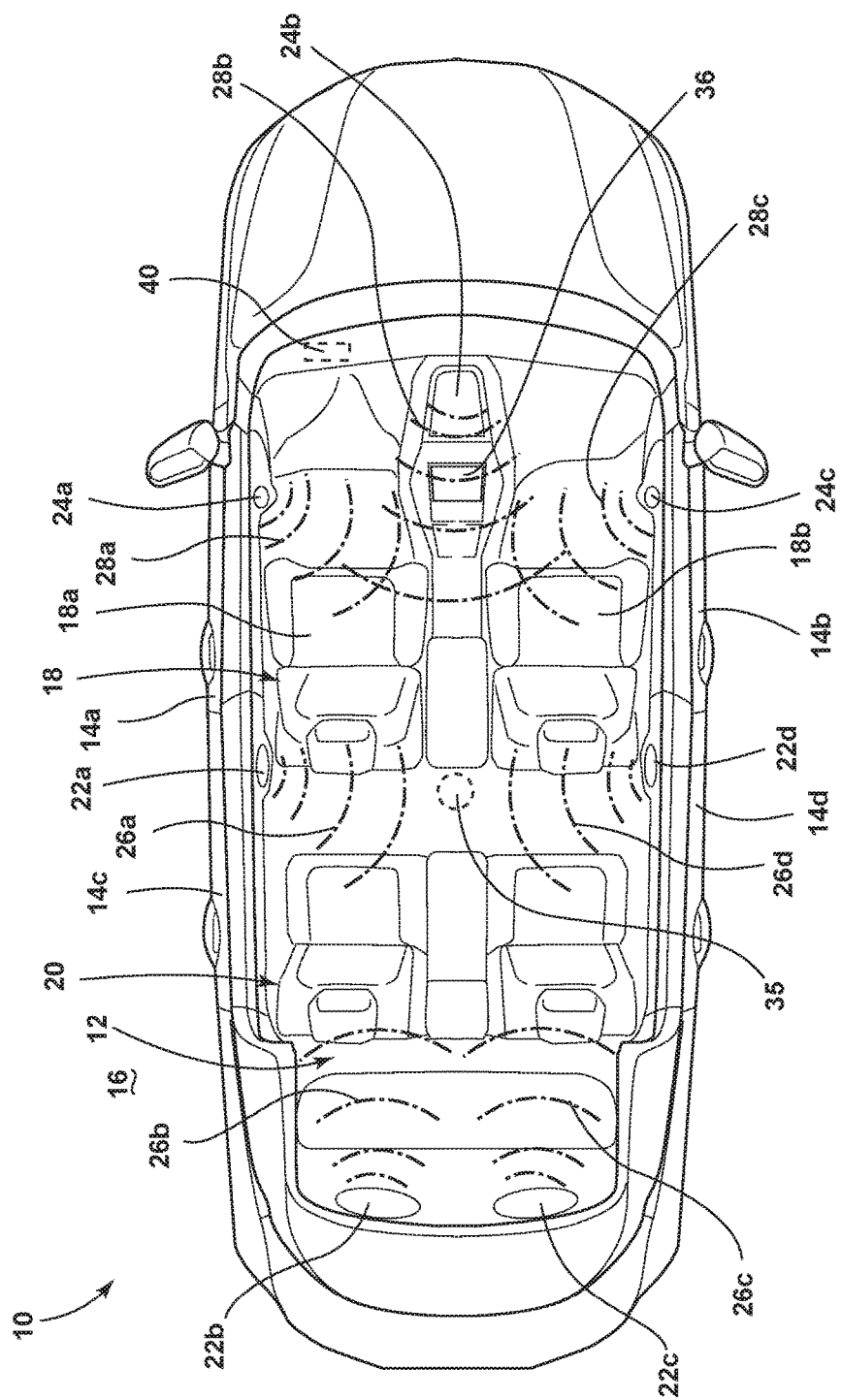
FIG. 1 is an overhead schematic view of an interior of a vehicle, illustrating one or more rear audio speakers generating sound waves to a rear row of seating.

For purposes of description herein, the positional terms such as "rear," "behind," "forward," "front," and derivatives thereof shall relate to the disclosure as oriented in FIG. 1. However, it is to be understood that the disclosure may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 2:
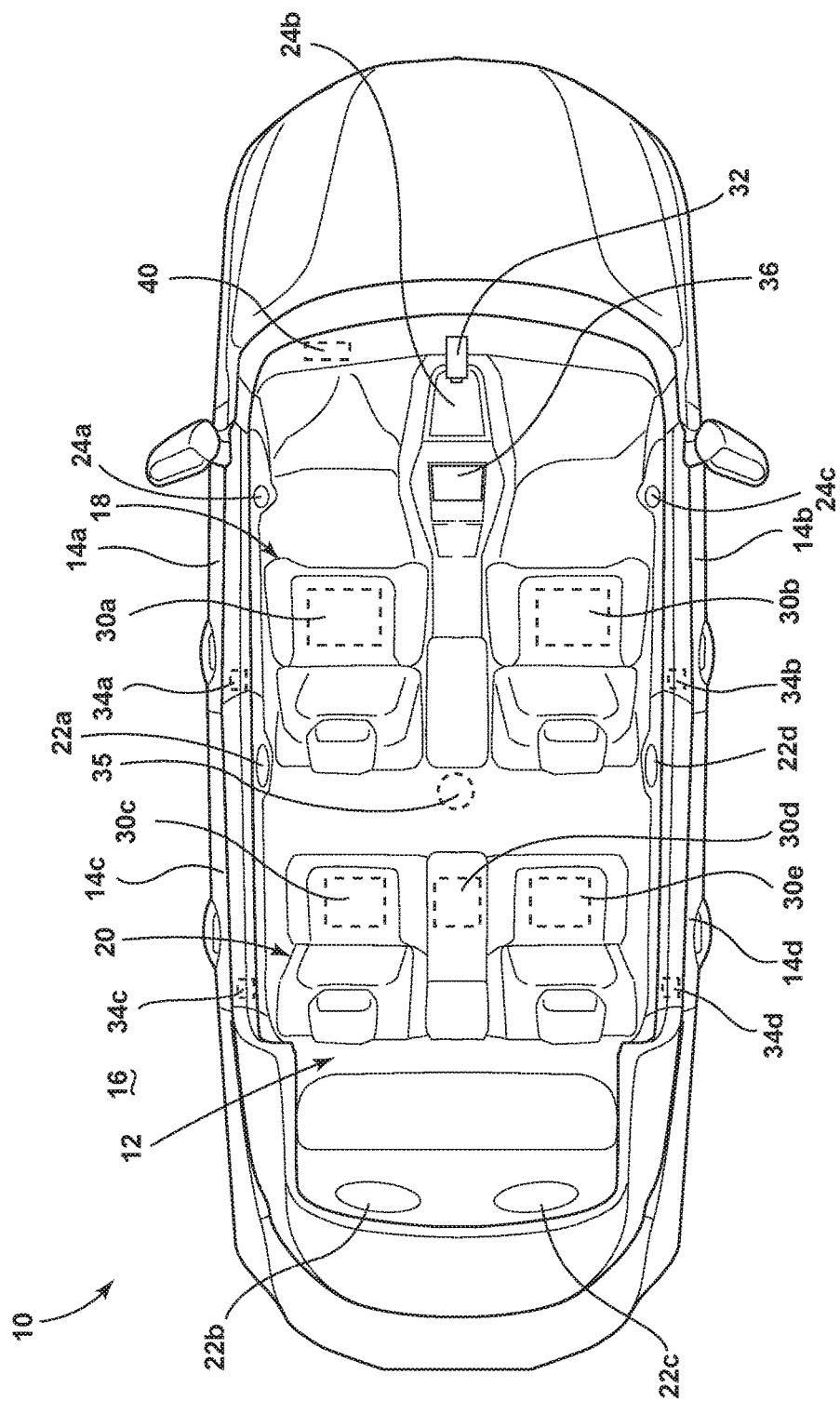
FIG. 2 is an overhead schematic view of the interior of the vehicle of FIG. 1, illustrating sensors including door condition sensors, seat occupancy sensors, and camera from which a controller can dynamically determine an occupancy state of the rear row of seating.
Figure 3:
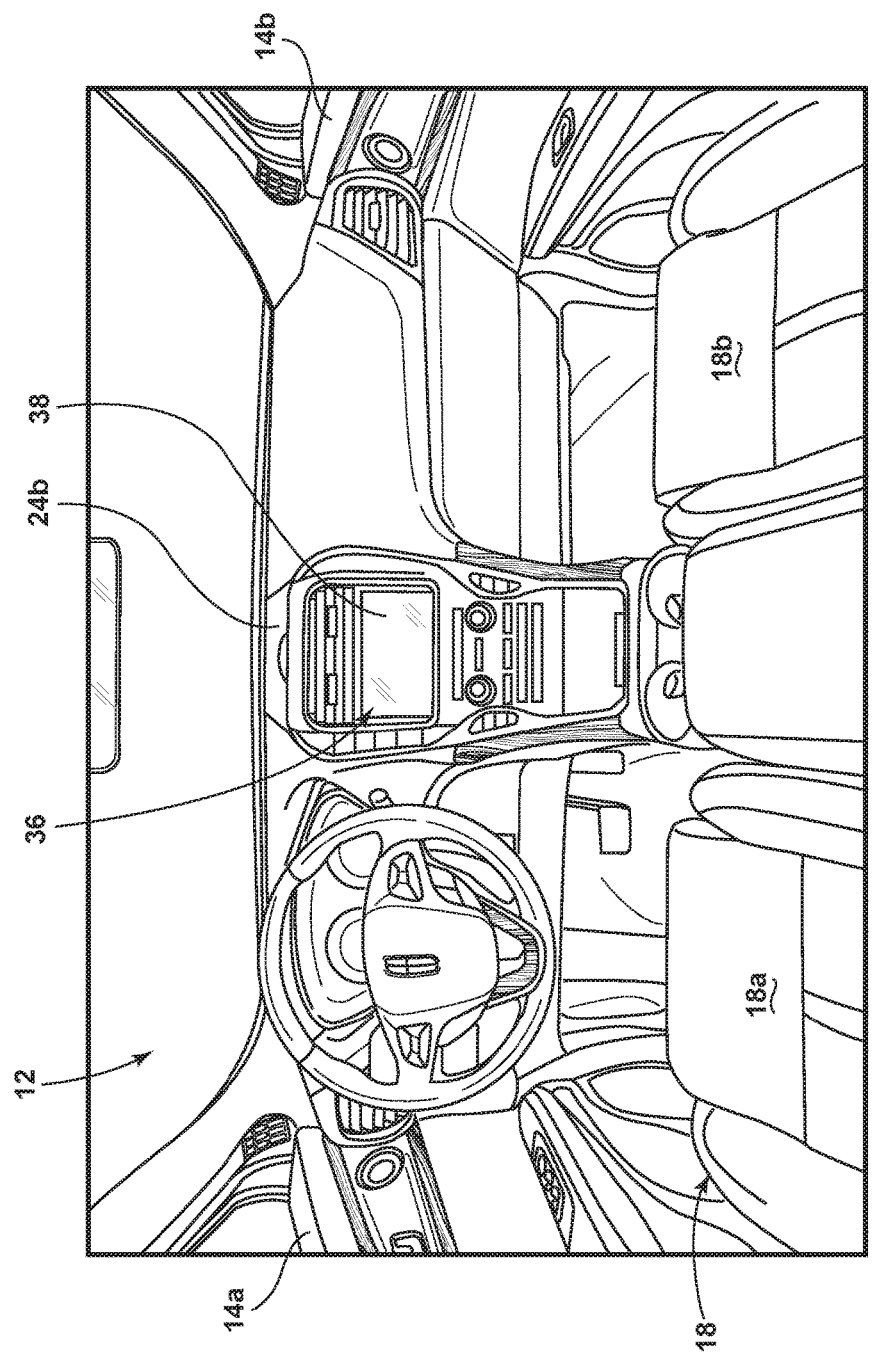
FIG. 3 is a perspective view of the interior of the vehicle of FIG. 1, illustrating a user interface with a touch screen display.

Referring now to FIGS. 1-3, a vehicle 10 includes an interior 12, passenger doors 14a-14d (including rear passenger doors 14c and 14d) separating the interior 12 from an exterior 16, and a front row of seating 18 disposed in the interior 12 including an operator seat 18a and a front passenger seat 18b. The vehicle 10 further includes a rear row of seating 20 disposed in the interior 12 behind the front row of seating 18, one or more rear audio speakers 22a-22d, and one or more front audio speakers 24a-24c. The one or more rear audio speakers 22a-22d direct sound waves 26a-26d primarily to the rear row of seating 20. The one or more rear audio speakers 22a-22d may be located behind the front row of seating 18. The one or more front audio speakers 24a-24c direct sound waves 28a-28c primarily to the front row of seating 18. The one or more front audio speakers 24a-24c may be located forward of the rear row of seating 20, adjacent the front row of seating 18, and forward of the front row of seating 18. Both the one or more rear audio speakers 22a-22d and the one or more front audio speakers 24a-24c have settings, which include volume, base, treble, among others.

The vehicle 10 (see particularly FIG. 2) further includes one or more sensors 30a-30e, 32, 34a-34d, 35, from which an occupancy state of the rear row of seating 20 and/or the front row of seating 18 can be determined. The one or more sensors 30a-30e, 32, 34a-34d, 35 can include seat occupancy sensors 30a-30e, which may be weight based, capacitance based, or vibration based, among other options, and may be also used to determine collision air bag deployment. Vibration based sensors are disclosed in U.S. Pat. No. 8,284,041, which is hereby incorporated by reference in its entirety. The one or more sensors 30a-30e, 32, 34a-34d, 35 can include an imaging device 32, such as a camera. The one or more sensors 30a-30e, 32, 34a-34d, 35 can include door condition sensors 34a-34d, which are positioned adjacent the passenger doors 14a-14d, respectively, and which provide signals from which it can be determined whether a particular door of the passenger doors 14a-14d is opened or closed. For example, door condition sensor 34c can be used to sense, and provide an input as to, whether rear passenger door 14c has opened. Further, the one or more sensors 30a-30e, 32, 34a-34d, 35 can include a motion sensor 35. The motion sensor 35 can sense motion that occurs in the rear row of seating 20. If the motion sensor 35 senses motion in the rear row of seating 20, an assumption can be made that the rear row of seating 20 is occupied.

The vehicle 10 (see particularly FIG. 3) further includes a user interface 36 disposed in the interior 12. The user interface 36 is accessible from the front row of seating 18 and can be particularly accessible from the operator seat 18a. The user interface 36 can include a touch screen display 38. The vehicle 10 (see particularly FIGS. 1-2) further includes a controller 40.

Figure 4:
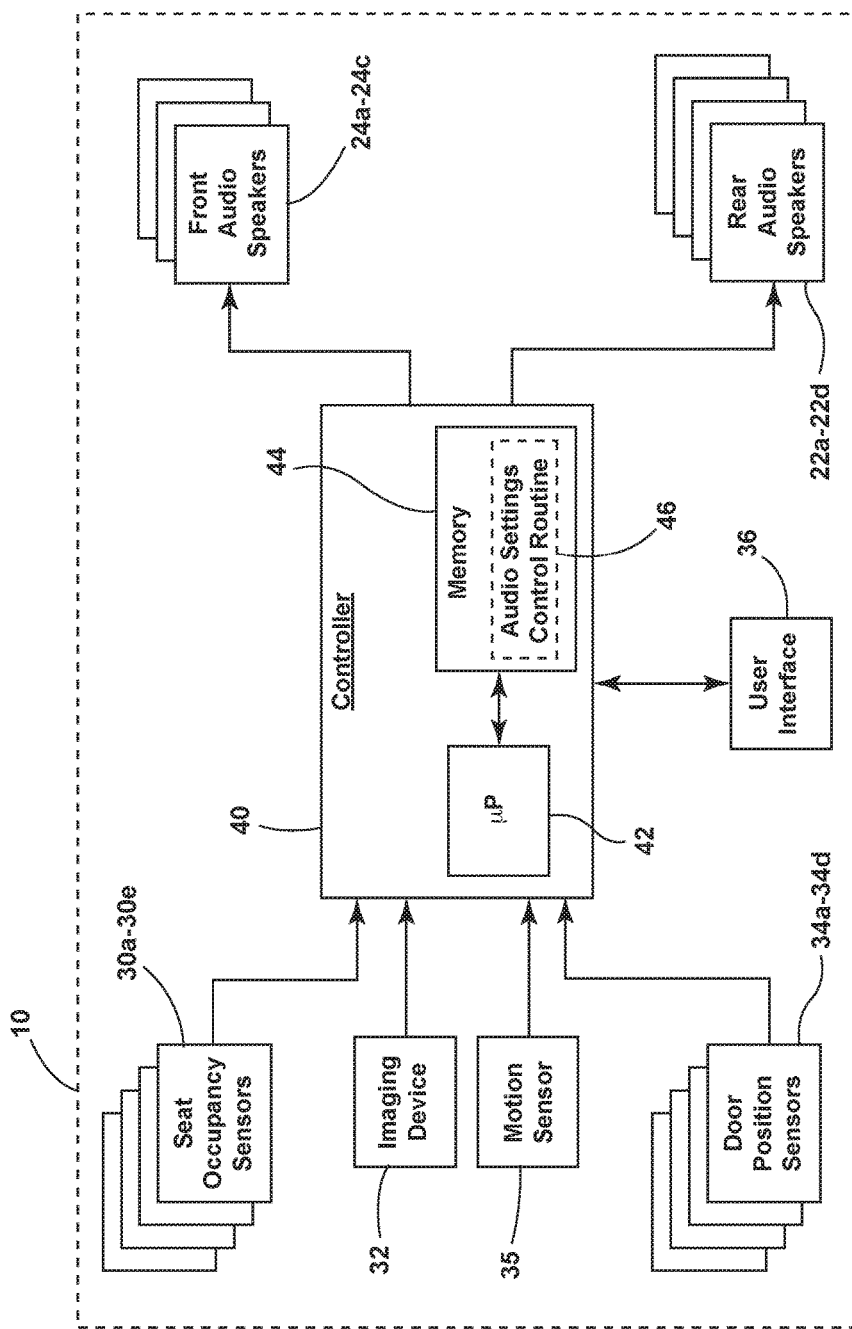
FIG. 4 is a schematic illustration of the controller of the vehicle of FIG. 1 utilizing various inputs such as the seat occupancy sensors to control the settings of the rear audio speakers through an audio settings control routine and a user interface.

Referring now to FIG. 4, the controller 40 may include control circuitry such as a microprocessor 42 and memory 44. The controller 40 is in communication with the user interface 36, the one or more rear audio speakers 22a-22d, the one or more front audio speakers 24a-24c, and the one or more sensors 30a-30e, 32, 34a-34d, 35. More specifically, the controller 40 accepts as input the data that the seat occupancy sensors 30a-30e, the imaging device 32, the door position sensors 34a-34d, the motion sensor 35, and the user interface 36 provide. The controller 40 then uses such data to control, such as via an audio settings control routine 46, the settings of the one or more front audio speakers 24a-24c and the settings of the one or more rear audio speakers 22a-22d and to communicate with an operator via the user interface 36. The memory 44 stores and the microprocessor 42 executes the audio settings control routine 46.

Figure 5:
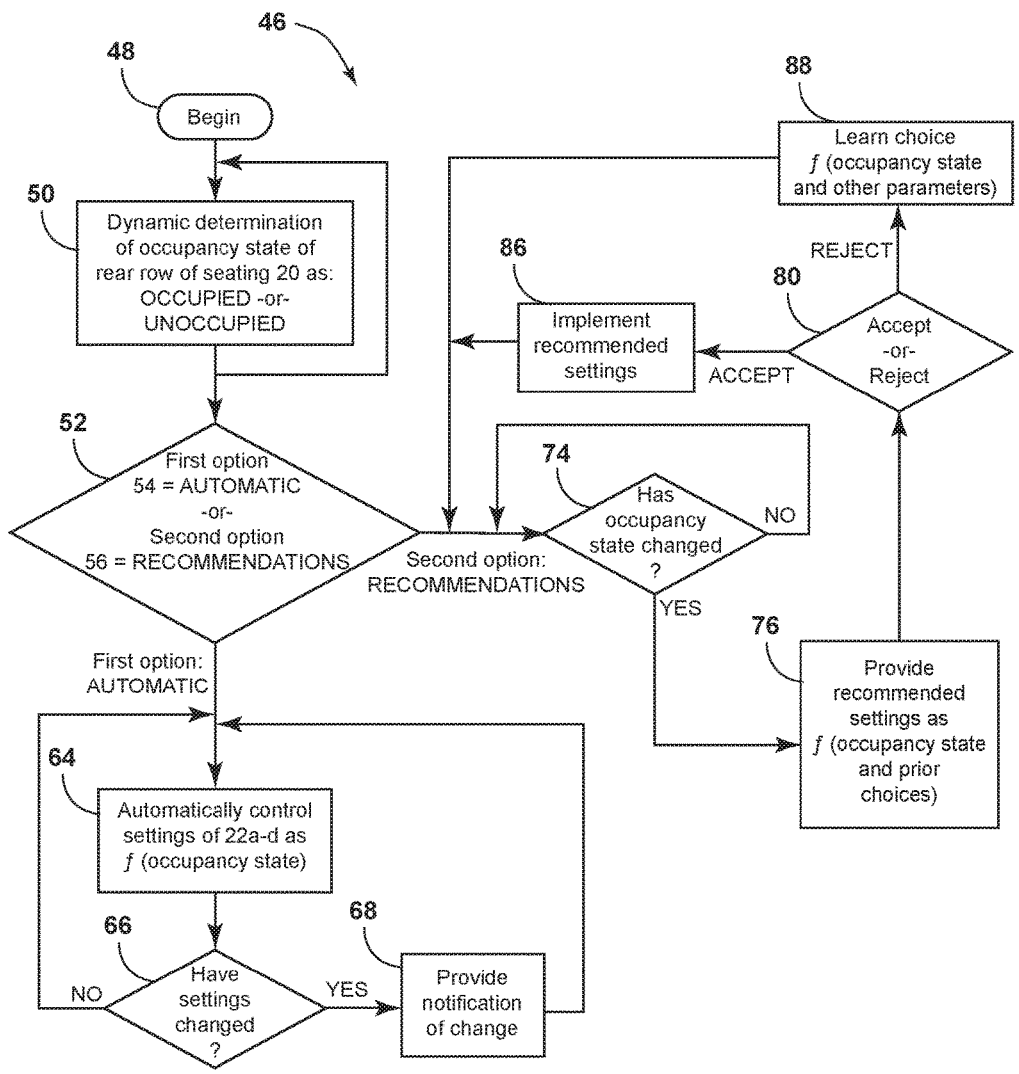
FIG. 5 is a flowchart for an embodiment of the audio settings control routine of FIG. 4 implementing a method of controlling the settings of the rear audio speakers of FIG. 1.

Referring now to FIG. 5, a method of controlling the settings of the one or more rear audio speakers 22a-22d, based on the dynamic determination of the occupancy state of the rear row of seating 20 as OCCUPIED or UNOCCUPIED, is disclosed herein. In this embodiment, the audio settings control routine 46 performs the method, although it should be understood that differently designed routines can perform the novel method disclosed herein. The audio settings control routine 46 is just one way that the novel method described herein can be performed to achieve the desired outcome.

At step 48, the audio settings control routine 46 begins and proceeds to step 50, where the method further includes the dynamic determination of the occupancy state of the rear row of seating 20. In this embodiment, at step 50, the controller 40, through the audio settings control routine 46, dynamically determines the occupancy state of the rear row of seating 20. The controller 40 dynamically determines the occupancy state based on the data received from the one or more sensors 30a-30e, 32, 34a-34d, 35. The occupancy state of the rear row of seating 20 can be either OCCUPIED, indicating the presence of one or more passengers in the rear row of seating 20, or UNOCCUPIED, indicating the presence of no passengers in the rear row of seating 20.

In some embodiments, the controller 40 can dynamically determine the occupancy state of the rear row of seating 20 based on the data received from only one sensor of the one or more sensors 30a-30e, 32, 34a-34d, 35. For example, the sensor can be the motion sensor 35 configured to detect motion in the rear row of seating 20. If the controller 40 receives input from the motion sensor 35 indicating motion, then the controller 40 can determine that the occupancy state of the rear row of seating 20 is OCCUPIED—that is, that a passenger is occupying the rear row of seating 20. Note that one passenger present within the rear row of seating 20 can result in the occupancy state determination of OCCUPIED; not all potential individual seating spots in the rear row of seating 20 needs to be occupied by a passenger.

In other embodiments, the controller 40, executing the audio settings control routine 46, can dynamically determine the occupancy state of the rear row of seating 20 based on the data received from more than one sensor of the one or more sensors 30a-30e, 32, 34a-34d, 35, that is, using more than one input provided by more than one sensor of the one or more sensors 30a-30e, 32, 34a-34d, 35. In such an embodiment, the controller 40 assigns a weight to each input to provide weighted inputs. The controller 40 then sums the weighted inputs to provide a summation. The controller then determines the occupancy state of the rear row of seating based on the summation. The following equation is representative:

$$\text{OccupancyState}_{Rear} = \sum_{i=1}^{N} \text{Sensor}_i \gamma_i$$

$\text{Sensor}_i$ is the input provided to the controller 40 by one of sensors of the one or more sensors 30a-30e, 32, 34a-34d, 35 and is assigned a detecting flag value of either 0 (for not detecting) or 1 (for detecting). In other words, if the input provided by a particular sensor exceeds a threshold value, then the controller 40 assumes that the sensor is detecting occupancy and assigns a detection flag value of 1 to that input. Contrarily, if the input provided by the particular sensor does not exceed the threshold value, then the controller 40 assumes that the sensor is not detecting occupancy and assigns a detection flag value of 0 to that input, essentially removing it from the summation. The variable $\gamma$ represents the weight (a value from 0 to 1) assigned to a particular input, recognizing that some sensors of the one or more sensors 30a-30e, 32, 34a-34d, 35, may provide better inputs from which the occupancy state can be determined than other inputs. The combined $\gamma$ weight value from all inputs equals 1. The following example provides clarity. In this example, $\text{Sensor}_1$ is the motion sensor 35 and is assigned a $\gamma$ weight value of 0.25, $\text{Sensor}_2$ is the door condition sensor 34c and is assigned a $\gamma$ weight value of 0.25, and $\text{Sensor}_3$ is the seat occupancy sensor 30c and is assigned a $\gamma$ weight value of 0.50. $\text{Sensor}_1$, the motion sensor 35, for whatever reason is not detecting sufficient motion from which the controller 40 would determine occupancy in the rear row of seating 20 and, thus, the controller 40 at that point in time assigns $\text{Sensor}_1$ a detection flag value of 0. $\text{Sensor}_2$, the door condition sensor 34c, having provided input to the controller 40 indicating that the rear passenger door 14c has been open and closed within a certain period of time (thus allowing an assumption that a passenger has entered the rear row of seating 20), is assigned a detection flag value of 1 by the controller. $\text{Sensor}_3$, the seat occupancy sensor 30c, having provided input to the controller 40 indicating the presence of a passenger near the seat occupancy sensor 30c, is assigned a detection flag value of 1 by the controller 40. The controller 40 then sums the weighted inputs, i.e., (0*0.25)+ (1*0.25)+(1*0.50), to obtain an OccupancyState$_{Rear}$ value of 0.75. The controller then compares the OccupancyState$_{Rear}$ value of 0.75 to a predetermined minimum threshold value of, for example, 0.51, to conclude that the occupancy state of the rear row of seating 20 is OCCUPIED. Had Sensor$_3$, the seat occupancy sensor 30c, not provided input to the controller 40 indicating the presence of a passenger, then the controller 40 would have assigned a detection flag value of 0. The resulting OccupancyState$_{Rear}$ value would have been 0.25, falling below the minimum threshold value of 0.51, resulting in the controller 40 concluding that the occupancy state of the rear row of seating is UNOCCUPIED. This example illustrates that using a plurality of sensors can result in a correct determination of occupancy state when one of those sensors (here, Sensor$_1$, provides an input leading to a detection flag value that does match the true state of occupancy).

As mentioned above, the occupation state of the rear row of seating 20 is dynamically determined, in this embodiment by the controller 40, and thus the occupation state may change (e.g., from OCCUPIED to UNOCCUPIED, or from OCCUPIED to UNOCCUPIED) as a function of time. The controller 40 may accept input from the one or more sensors 30a-30e, 32, 34a-34d, 35 indicating a change in value where the controller 40 assumes a change in the occupation state. To further the example above, Sensor$_3$, the seat occupancy sensor 30c, changes from providing input to the controller 40 indicating the presence of a passenger at one point in time to providing input to the controller 40 indicating no presence of a passenger at another point in time, in which case the controller 40 changes from assigning a detection flag value of 1 to a value of 0. Similarly, Sensor$_1$, the door condition sensor 34c, indicating another cycle of the rear passenger door 14c opening and closing (allowing for the assumption that a passenger has exited the vehicle 10), is assigned a detection flag value of 0 by the controller 40. The controller 40 then sums the weighted inputs, i.e., (0*0.25)+(0*0.25)+ (0*0.50), to obtain an OccupancyState$_{Rear}$ value of 0 and thus the controller 40 concludes that the occupation state of the rear row of seating 20 is now UNOCCUPIED. As the determination of the occupancy state of the rear row of seating 20 is dynamic, step 50 constantly loops back to itself while also proceeding to step 52.

Figure 6:
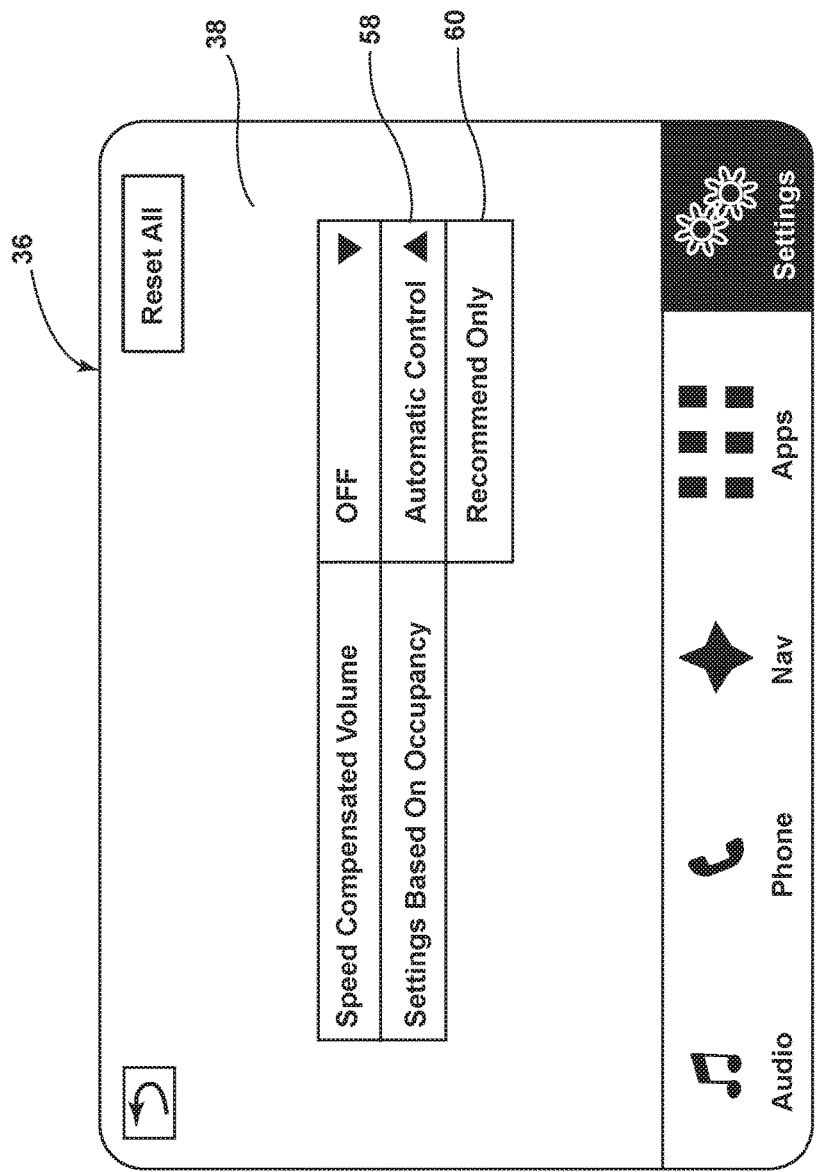
FIG. 6 is a schematic illustration of the touch screen display of FIG. 3 providing a first graphical representation for an operator to select to choose automatic control of the settings of the rear audio speakers and a second graphical representation for an operator to select to choose recommendations only for the settings of the rear audio speakers.

At step 52, an operator of the vehicle 10 is requested to make a choice between a first option 54 and a second option 56. The choice between the first option 54 and the second option 56 may be selected in advance by the operator and stored in the controller 40. If the operator chooses the first option 54, then the vehicle 10 automatically controls the settings of the one or more rear audio speakers 22a-22d based on a dynamically determined occupancy state of the rear row of seating 20. If the operator chooses the second option 56, then vehicle 10 does not automatically control the settings of the rear audio speakers 22a-22d but, rather, recommends the settings for the one or more rear audio speakers 22a-22d to the operator based on the dynamically determined occupancy state of the rear row of seating 20. The controller 40, via the audio settings control routine 46, requests the operator of the vehicle 10, via the user interface 36, to make the choice between the first option 54 and the second option 56. For example, as illustrated in FIG. 6, in an embodiment where the user interface 36 includes a touch screen display 38, the controller 40 can cause the touch screen display 38 to present (display) a first graphical representation 58 symbolizing the first option 54 and a separate second graphical representation 60 symbolizing the second option 56. The operator then makes the choice between the first option 54 and the second option 56 by touching either the first graphical representation 58 (to choose the first option 54) or the second graphical representation 60 (to choose the second option 56). Once the operator makes the choice by touching, the user interface 36 communicates the selection to the controller 40 and the audio settings control routine 46 proceeds to the next step accordingly. If the operator chooses the first option 54 (AUTOMATIC), then the audio settings control routine 46 proceeds to step 64. However, if the operator chooses the second option 56 RECOMMENDATIONS), then the audio settings control routine 46 proceeds to step 74.

If the operator chooses the first option 54 (AUTOMATIC), then the method further includes automatically controlling the settings of the rear audio speakers 22a-22d based on the dynamically determined occupancy state. In this embodiment, at step 64 of the audio settings control routine 46, the controller 40 automatically sets the settings of the one or more rear audio speakers 22a-22d based on the dynamically determined occupancy state of the rear row of seating 20. As mentioned, the settings include volume. Thus, for example, the controller 40 can set the volume of the one or more rear audio speakers 22a-22d to a predetermined level (such as, no volume), if the controller 40 dynamically determines that the occupancy state (dynamically determined at step 50) is UNOCCUPIED. Similarly, as another example, the controller 40 can set the volume of the one or more rear audio speakers 22a-22d lower (i.e., decrease the volume, such as to no volume), if the controller 40 dynamically determines that the occupancy state changes from OCCUPIED to UNOCCUPIED. Alternatively, for example, the controller 40 can set the volume of the one or more rear audio speakers 22a-22d to a predetermined level (such as, volume level matching the volume level of the front audio speakers 24a-24c), if the controller 40 dynamically determines that the occupancy state is OCCUPIED. Similarly, as another example, the controller 40 can set the volume of the one or more rear audio speakers 22a-22d higher (i.e., increase the volume, such as to match the volume level of the front audio speakers 24a-24c), if the controller 40 dynamically determines that the occupancy state changes from UNOCCUPIED to OCCUPIED. The audio settings control routine 46 then proceeds to step 66.

Figure 7:
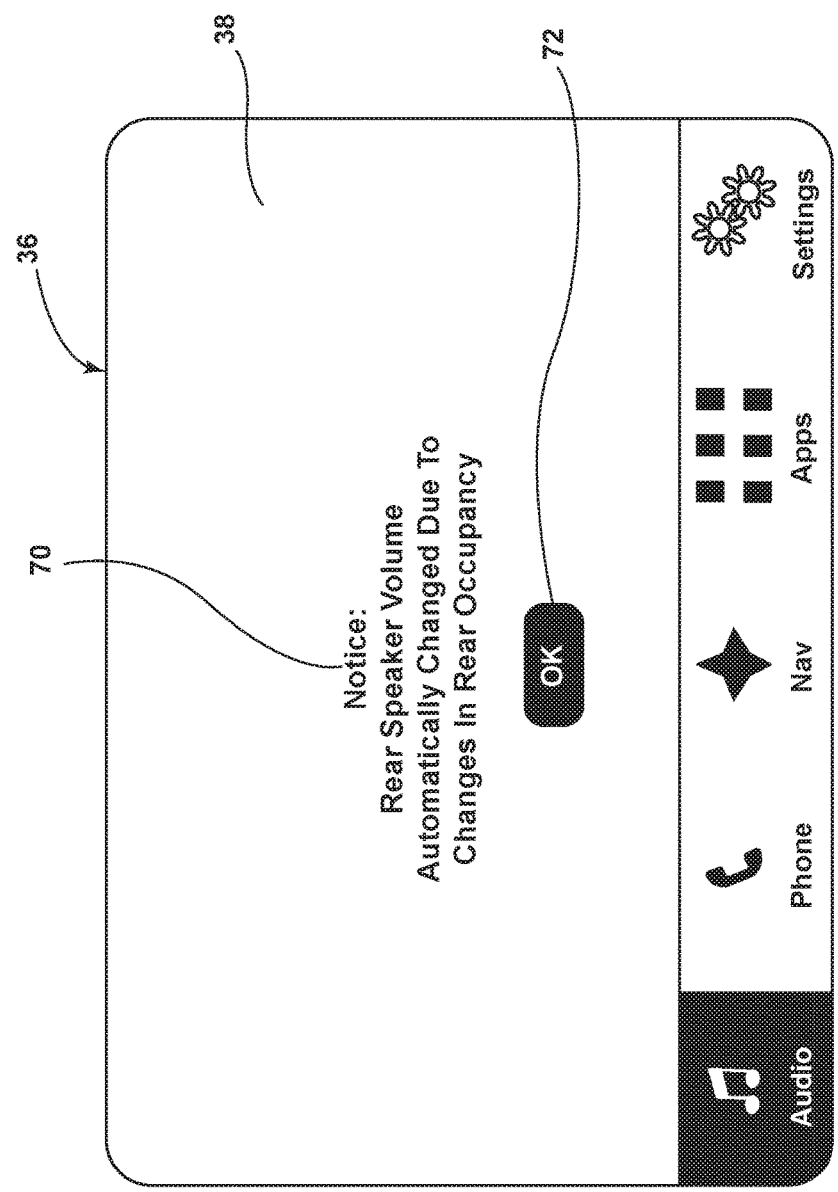
FIG. 7 is a schematic illustration of the touch screen display of FIG. 3 providing a notification of the recommended settings and an acceptance box for the operator to touch.

The method further includes notifying the operator of a change of the settings of the rear audio speakers 22a-22d after automatically making a change of the settings. In this embodiment, at step 66 of the audio settings control routine 46, the controller 40 considers whether the automatic control of the settings of the one or more rear audio speakers 22a-22d has resulted in a change in the settings. If the answer is NO, then the audio settings control routine 46 returns to a previous step, such as step 64. However, if the answer is yes, then the audio settings control routine 46 proceeds to step 68. At step 68, the controller 40 notifies the operator of the new settings through the user interface 36, and then returns to a previous step, such as step 64. As illustrated in FIG. 7, when the user interface 36 includes a touch screen display 38, the controller 40 can cause the touch screen display 38 to display a notification 70 of the change of the automatically controlled settings of the rear audio speakers 22a-22d and include an acceptance box 72, which the operator touches to acknowledge the notification 70. For example, if the controller 40 automatically decreased the volume of the rear audio speakers 22a-22d after the occupancy state changed from OCCUPIED to UNOCCUPIED, then the controller 40 via the user interface 36 notifies the operator that the volume of the one or more rear audio speakers 22a-22d has been decreased. Similarly, after the controller 40 automatically increases the volume of the one or more rear audio speakers 22a-22d due to a change in the occupancy state from UNOCCUPIED to OCCUPIED, the controller 40, via the user interface 36, notifies the operator that the volume of the one or more rear audio speakers 22a-22d has been increased. The notification to the operator can alternatively be provided audibly (e.g., an audible statement "rear audio speaker volume has been decreased"), graphically (e.g., a graphical representation of a rear audio speaker with a line through it indicating no volume), among other ways.

As mentioned above, at step 52, instead of choosing the first option 54 (AUTOMATIC), the operator can choose the second option 56 (RECOMMENDATIONS). If the operator chooses the second option 56, the method further includes recommending the settings for the one or more rear audio speakers 22a-22d to the operator based on the dynamically determined occupancy state of the rear row of seating 20 instead of automatically controlling the settings of the one or more rear audio speakers 22a-22d. In this embodiment, if the operator chooses the second option 56 at step 52, then the audio settings control routine 46 proceeds to step 74, which queries whether the dynamically determined occupancy state of the rear row of seating 20 has changed. If the answer is NO, then the audio settings control routine 46 returns back to a previous step or repeats the same step 74.

Figure 8:
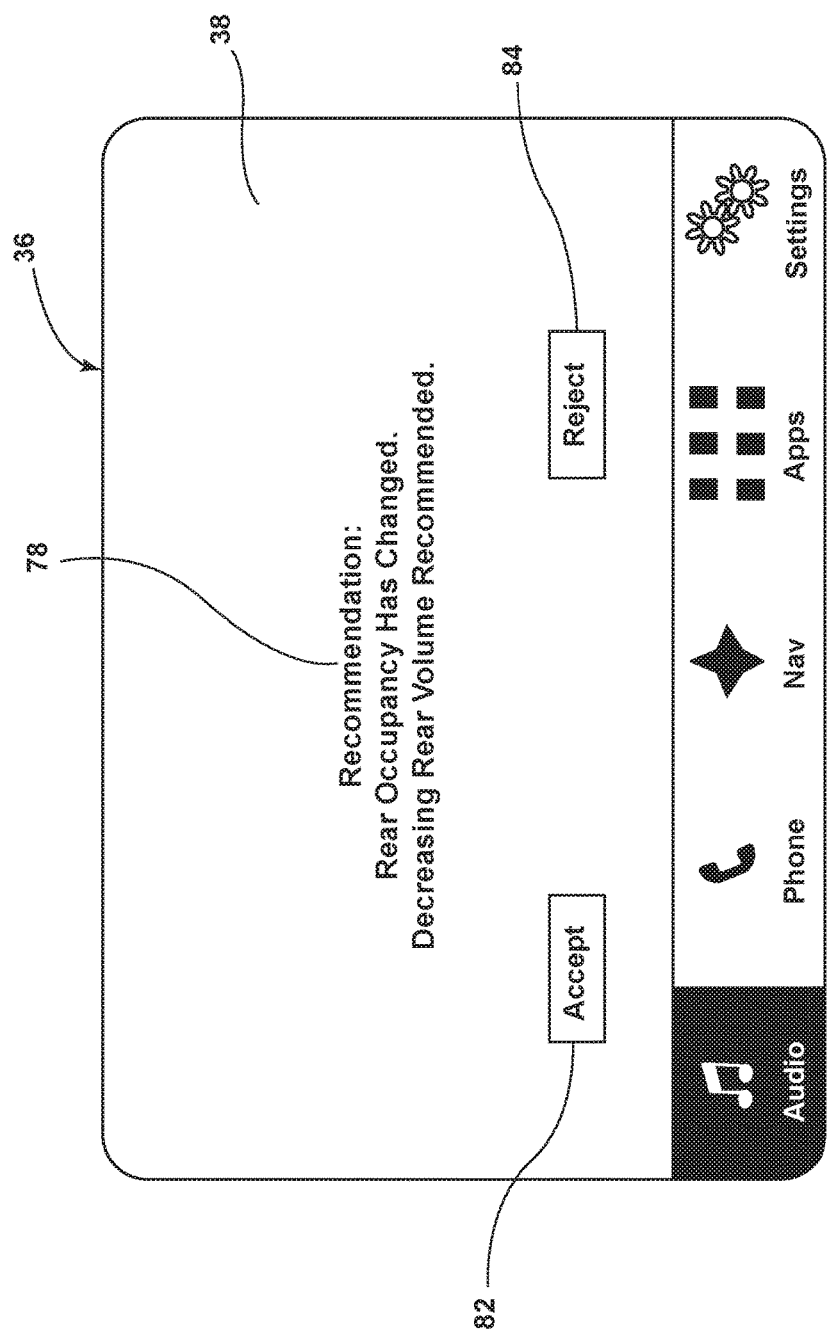
FIG. 8 is a schematic illustration of the touch screen display of FIG. 3 providing a recommendation of the settings for the rear audio speakers based on a change in the occupancy state of the rear row of seating, an acceptance button, and a rejection button.

However, if the answer is YES, then the audio settings control routine 46 proceeds to step 76. At step 76, the controller 40 provides recommended settings for the rear audio speakers 22a-22d to the operator through the user interface 36 based on the dynamically determined occupancy state, including after the dynamically determined occupancy changes from either UNOCCUPIED to OCCUPIED or from OCCUPIED to UNOCCUPIED. For example, as illustrated in FIG. 8, the controller 40 can provide a recommendation 78 of the settings for the rear audio speakers 22a-22d on the touch screen display 38. Among other things, the recommendation 78 could be that the volume of the one or more rear audio speakers 22a-22d be decreased to a predetermined volume level (such as no volume) after the dynamically determined occupancy state changes from OCCUPIED to UNOCCUPIED. Similarly, the recommendation 78 could be that the volume of the rear audio speakers 22a-22d be increased to a predetermined volume level (such as, a volume level matching the volume level of the one or more front audio speakers 24a-24c) after the dynamically determined occupancy state changes from UNOCCUPIED to OCCUPIED. At step 76, the controller 40 may also account for choices that the operator has made under the same conditions, in addition to the change in the dynamically determined occupancy, as discussed below, in determining the recommendation 78 to provide to the operator. After providing the recommendation 78, the audio settings control routine 46 proceeds to step 80.

The method further includes prompting the operator to accept or reject the recommended settings for the one or more rear audio speakers 22a-22d. At step 80, the audio settings control routine 46 queries whether the operator ACCEPTS or REJECTS the recommended settings. For example, again illustrated in FIG. 8, the controller 40 can include an "ACCEPT" button 82 and a "REJECT" button 84 below the recommendation 78 on the touch screen display 38 of the user interface 36. The operator touches either the "ACCEPT" button 82 or the "REJECT" button 82 to indicate the operator's choice and the user interface 36 transmits the data to the controller 40.

The method further includes implementing the recommended settings for the one or more rear audio speakers 22a-22d, if the operator accepts the recommended settings for the one or more rear audio speakers 22a-22d. In this embodiment, if the operator indicates acceptance (ACCEPT) at step 74, the audio settings control routine 46 proceeds to step 86, wherein the controller 40 implements the recommended settings for the rear audio speakers 22a-22d. The audio settings control routine 46 then proceeds back to a previous step, such as step 74.

The method further includes alternatively not implementing the recommended settings and instead maintaining the status quo settings, if the operator rejects (REJECT) the recommended settings for the one or more rear audio speakers 22a-22d. In this embodiment, if the operator rejects the recommendations at step 74, the controller 40 does not implement the recommended settings for the rear audio speakers 22a-22d and maintains the status quo settings. The audio settings control routine 46 can then return to a prior step, such as step 74, or proceed to step 88, discussed below.

The method further includes learning the operator's preference whether to accept or reject the recommended settings for any particular dynamically determined occupancy state, and subsequently recommending different settings when the dynamically determined occupancy state is present. In this embodiment, at step 88, the audio settings control routine 46 causes the controller 40 to record the operator's choice and the occupancy state at the time the choice was made. The audio settings control routine 46 may further cause the controller 40 to record other data, such as the time of the day, location, among other things. Thereafter, at step 76 of the audio settings control routine 46, the controller 40 can recommend different settings than the settings that the operator previously rejected under the same conditions. For example, if the operator rejects the provided recommendation that the volume of the rear audio speakers 22a-22d be decreased after the dynamically determined occupancy state changes from OCCUPIED to UNOCCUPIED at step 76, the controller 40 records this choice and will provide a subsequent recommendation that the volume rear audio speakers 22a-22d not be decreased if the dynamically determined occupancy state subsequently changes from OCCUPIED to UNOCCUPIED. Again, the controller 40 can tie the recommendation to other parameters (time, location, etc.) that existed when the operator rejected the initial recommendation after a change in the dynamically determined occupancy state. The audio settings control routine 46 then returns to a previous step, such as step 74.

In some embodiments, the method can further include dynamically determining the occupancy state of the front row of seating 18, as either OCCUPIED or UNOCCUPIED, in the same manner as above, using one or more sensors 30a-30e, 32, 34a-34d, 35. The method can further include controlling the settings (including volume) of the one or more front audio speakers 24a-24c as a function of the dynamically determined occupancy state of the front row of seating 18. For example, the controller 40 can be configured to prevent the one or more front audio speakers 24a-24c from generating sound waves 28a-28c (i.e., volume set to zero), if the controller 40 dynamically determines (based on input from the sensors 30a-30e, 32, 34a-34d, 35) that the front row of seating is UNOCCUPIED (such as when the operator leaves the vehicle 10 running but unattended). Then, when the operator returns to the vehicle 10, the sensors 30a-30e, 32, 34a-34d, 35 change their input to the controller 40, which then determines the occupancy state of the front row of seating 18 is OCCUPIED. The controller 40 then automatically readjusts the settings of the front audio speakers 24a-24c to generate sound waves 28a-28c (i.e., volume reset to the initial volume level).

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A method of controlling audio speaker settings in a vehicle with a rear row of seating comprising:
   requesting an operator of the vehicle to make a choice between:
      a first option, wherein the vehicle automatically controls audio speaker settings based on a dynamically determined occupancy state of the rear row of seating; and
      a second option, wherein the vehicle recommends audio speaker settings to the operator based on the dynamically determined occupancy state;
   dynamically determining the occupancy state;
   if the operator chooses the first option, then automatically controlling audio speaker settings based on the dynamically determined occupancy state; and
   if the operator chooses the second option, then providing recommended audio speaker settings to the operator based on the dynamically determined occupancy state.

2. The method of claim 1, wherein the audio speaker settings include volume.

3. The method of claim 2, wherein automatically controlling audio speaker settings based on the dynamically determined occupancy state comprises:
   decreasing rear audio speaker volume if the occupancy state is dynamically determined to have changed from occupied to unoccupied; and
   increasing rear audio speaker volume if the occupancy state is dynamically determined to have changed from unoccupied to occupied.

4. The method of claim 3, wherein dynamically determining the occupancy state comprises:
   using more than one input, assigning a weight to each input to provide weighted inputs, summing the weighted inputs to provide a summation, and determining the occupancy state based on the summation.

5. The method of claim 4, where the more than one input includes whether a passenger rear door has opened.

6. The method of claim 2, wherein requesting the operator to make a choice between the first option and the second option comprises:
   presenting a first graphical representation symbolizing the first option and a second graphical representation symbolizing the second option on a touch screen user interface and the operator makes the choice by touching either the first graphical representation or the second graphical representation.

7. The method of claim 2, wherein providing recommended audio speaker settings to the operator based on the dynamically determined occupancy state comprises:
   providing a recommendation that rear audio speaker volume be decreased to a predetermined volume level after the dynamically determined occupancy state changes from occupied to unoccupied; and
   providing a recommendation that rear audio speaker volume be increased to a predetermined volume level after the dynamically determined occupancy state changes from unoccupied to occupied.

8. The method of claim 3 further comprising:
   notifying the operator that the rear audio speaker volume has been decreased after automatically decreasing rear audio speaker volume; and
   notifying the operator that the rear audio speaker volume has been increased after automatically increasing rear audio speaker volume.

9. The method of claim 7 further comprising:
   prompting the operator to accept or reject the recommended rear audio speaker settings and learning and storing the operator's acceptance or rejection, along with the occupancy state, for subsequent recommended rear audio speaker settings.

10. The method of claim 9 further comprising:
    if the operator accepts the recommended rear audio speaker settings, then implementing the recommended rear audio speaker settings; and
    if the operator rejects the provided recommendation that rear audio speaker volume be decreased after the dynamically determined occupancy state changes from occupied to unoccupied, then not implementing the recommended rear audio speaker settings and providing a subsequent recommendation that rear audio speaker volume not be decreased if the dynamically determined occupancy state subsequently changes from occupied to unoccupied.

11. A vehicle comprising:
    a rear row of seating;
    one or more rear audio speakers having settings;
    one or more sensors, from which an occupancy state of the rear row of seating can be determined;
    a user interface; and
    a controller in communication with the user interface, the one or more rear audio speakers; and the one or more sensors;
    wherein, the controller dynamically determines the occupancy state of the rear row of seating based on data provided by the one or more sensors; and
    wherein, the controller, via the user interface, requests an operator of the vehicle to make a choice between:
        a first option, wherein the controller automatically controls the settings of the one or more rear audio speakers based on the occupancy state of the rear row of seating; and
        a second option, wherein the controller recommends settings, via the user interface to the operator, for the one or more rear audio speakers based on the occupancy state of the rear row of seating.

12. The vehicle of claim 11,
    wherein, if the operator chooses the first option, then the controller automatically sets the settings of the one or more rear audio speakers based on the occupancy state of the rear row of seating; and
    wherein, if the operator chooses the second option, then the controller provides to the operator, via the user interface, recommended settings of the one or more rear audio speakers based on the occupancy state of the rear row of seating.

13. The vehicle of claim 12,
    wherein, the settings of the one or more rear audio speakers include volume.

14. The vehicle of claim 13,
wherein, if the operator chooses the first option, then the controller further:
- decreases the volume of the one or more rear audio speakers, if the controller dynamically determines that the occupancy state changes from occupied to unoccupied; and
- increases the volume of the one or more rear audio speakers, if the controller dynamically determines that the occupancy state changes from unoccupied to occupied.

15. The vehicle of claim 13,
wherein, the one or more sensors provide more than one input to the controller; and
wherein, the controller assigns a weight to each input to provide weighted inputs, sums the weighted inputs to provide a summation, and determines the occupancy state based on the summation.

16. The vehicle of claim 15 further comprising:
a rear passenger door;
wherein, the one or more sensors include a door condition sensor;
wherein, the controller determines based on the input provided by the door condition sensor that the rear passenger door has opened; and
wherein, the controller determines the occupancy state based, at least in part, on the determination that the rear passenger door has opened.

17. The vehicle of claim 13,
wherein, the user interface is a touch screen;
wherein, the user interface displays a first graphical representation symbolizing the first option and a second graphical representation symbolizing the second option; and
wherein, the operator makes the choice by touching either the first graphical representation or the second graphical representation.

18. The vehicle of claim 13,
wherein, if the operator chooses the second option, then the controller further:
- recommends to the operator, via the user interface, that the volume of the one or more rear audio speakers be decreased if the controller dynamically determines that the occupancy state changes from occupied to unoccupied; and
- recommends to the operator, via the user interface, that the volume of the one or more rear audio speakers be increased if the controller dynamically determines that the occupancy state changes from unoccupied to occupied.

19. The vehicle of claim 14,
wherein, the controller, via the user interface, notifies the operator that the volume of the one or more rear audio speakers has been decreased after the controller automatically decreased the volume of the one or more rear audio speakers; and
wherein, the controller, via the user interface, notifies the operator that the volume of the one or more rear audio speakers has been increased after the controller automatically increased the volume of the one or more rear audio speakers.

20. The vehicle of claim 18,
wherein, if the controller recommends to the operator, via the user interface, that the volume of the one or more rear audio speakers be increased or decreased, then the controller prompts the operator, via the user interface, to accept or reject the recommended rear audio speaker settings.

* * * * *